United States Patent
Lee et al.

(10) Patent No.: US 9,204,538 B2
(45) Date of Patent: Dec. 1, 2015

(54) METHOD OF FINE LINE SPACE RESOLUTION LITHOGRAPHY FOR INTEGRATED CIRCUIT FEATURES USING DOUBLE PATTERNING TECHNOLOGY

(71) Applicant: Taiwan Semiconductor Manufacturing Company, Ltd., Hsin-Chu (TW)

(72) Inventors: Chia-Ying Lee, New Taipei (TW); Jyu-Horng Shieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 21 days.

(21) Appl. No.: 13/968,804

(22) Filed: Aug. 16, 2013

(65) Prior Publication Data

US 2015/0047891 A1   Feb. 19, 2015

(51) Int. Cl.
| | |
|---|---|
| *H05K 1/11* | (2006.01) |
| *H05K 1/02* | (2006.01) |
| *H05K 3/00* | (2006.01) |
| *H01L 21/033* | (2006.01) |
| *H01L 21/308* | (2006.01) |
| *H01L 21/311* | (2006.01) |

(52) U.S. Cl.
CPC .......... *H05K 1/0296* (2013.01); *H01L 21/0337* (2013.01); *H01L 21/3086* (2013.01); *H01L 21/31144* (2013.01); *H05K 1/11* (2013.01); *H05K 3/002* (2013.01); *H05K 2201/09236* (2013.01)

(58) Field of Classification Search
CPC .... H01L 21/306; H01L 21/302; H01L 21/208
USPC .................................................. 438/400, 689
See application file for complete search history.

(56) References Cited

U.S. PATENT DOCUMENTS

| | | | |
|---|---|---|---|
| 2010/0130016 A1 | 5/2010 | DeVilliers | |
| 2012/0074583 A1* | 3/2012 | Dao .............................. | 257/774 |
| 2014/0370684 A1* | 12/2014 | Khurana et al. .............. | 438/386 |

* cited by examiner

*Primary Examiner* — Selim Ahmed
*Assistant Examiner* — Changhyun Yi
(74) *Attorney, Agent, or Firm* — Slater & Matsil, L.L.P.

(57) ABSTRACT

A method includes forming a hard mask over a base material, and forming an I-shaped first opening in the hard mask. The first opening includes two parallel portions and a connecting portion interconnecting the two parallel portions. Spacers are formed on sidewalls of the first opening. The spacers fill an entirety of the connecting portion, wherein a center portion of each of the two parallel portions is unfilled by the spacers. The hard mask is etched to remove a portion of the hard mask and to form a second opening, wherein the second opening is between the two parallel portions of the first opening. The second opening is spaced apart from the two parallel portions of the first opening by the spacers. The first opening and the second opening are then extended down into the base material.

20 Claims, 20 Drawing Sheets

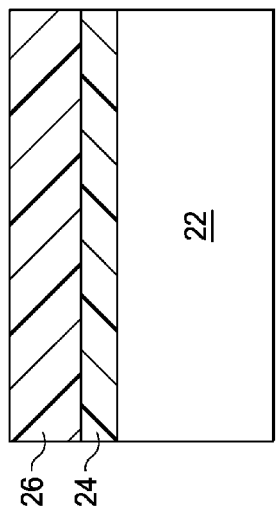
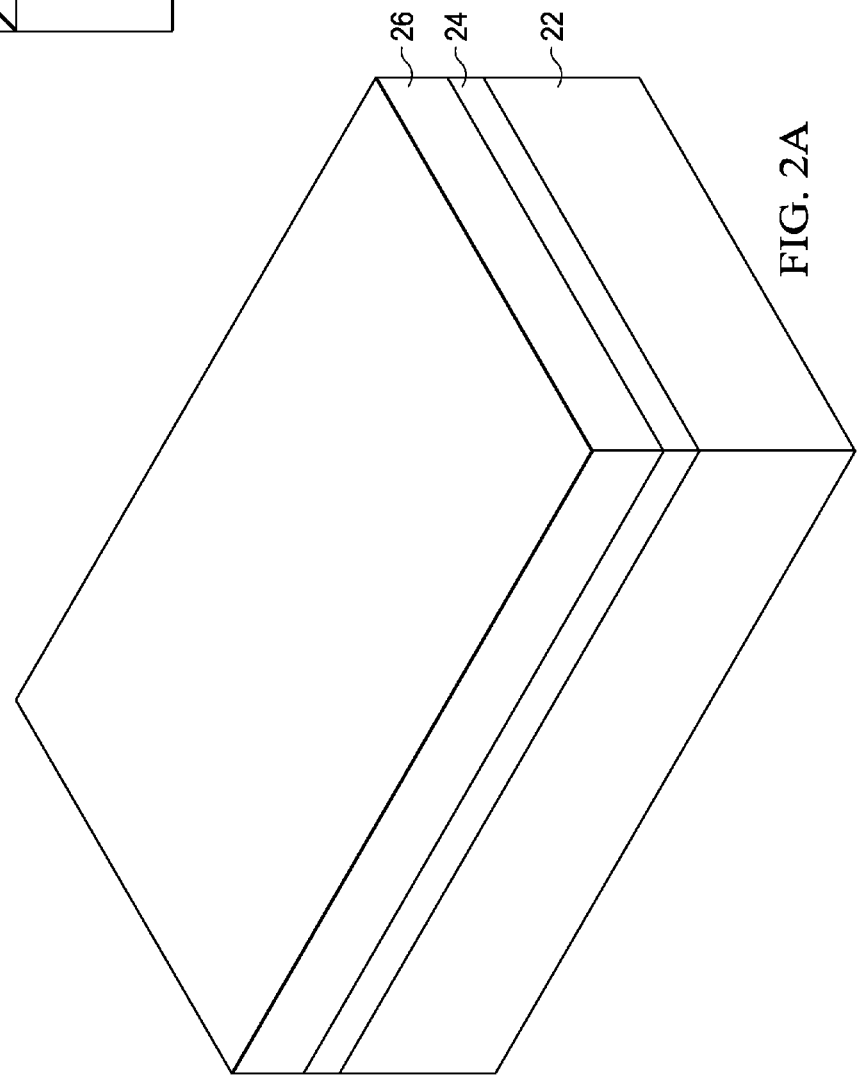

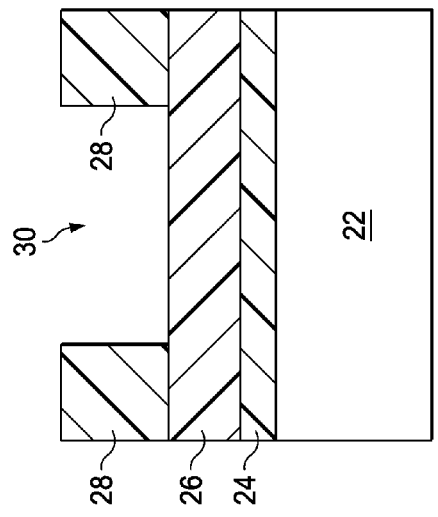
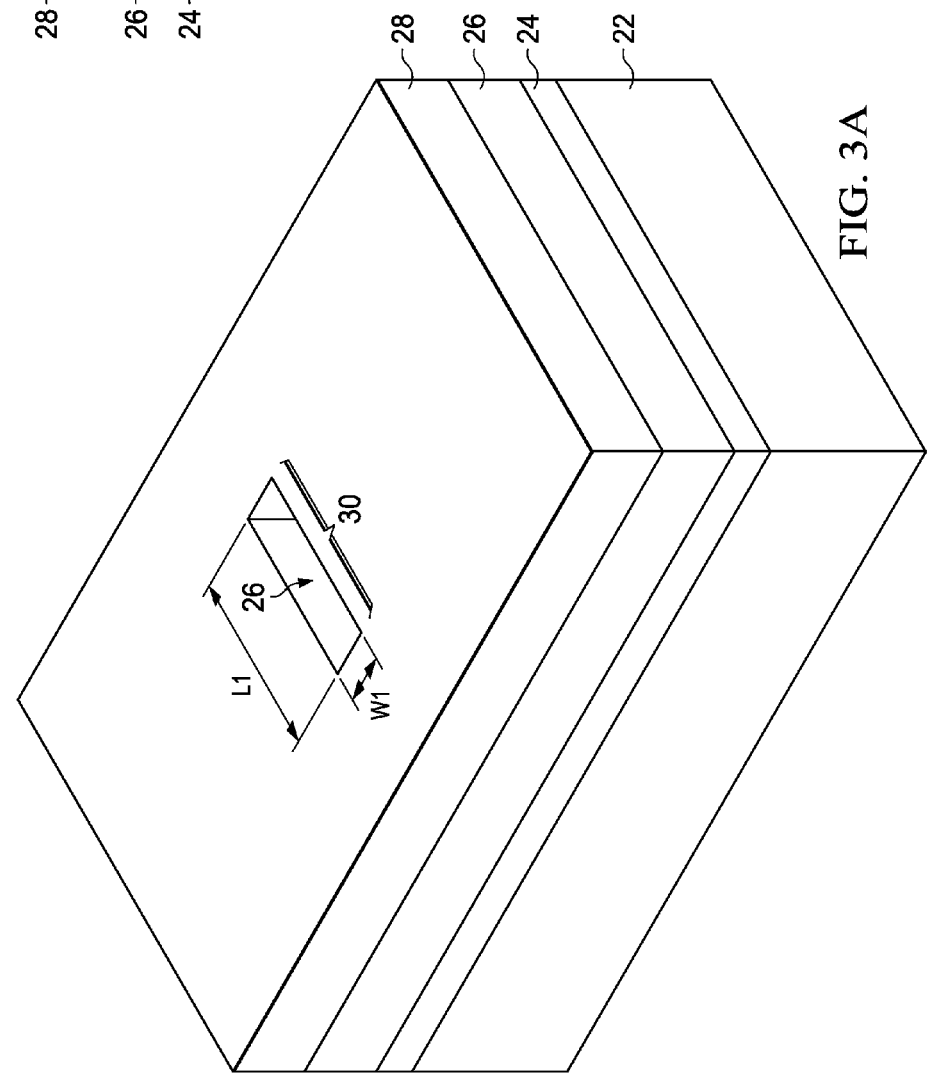
FIG. 3B
FIG. 3A

METHOD OF FINE LINE SPACE RESOLUTION LITHOGRAPHY FOR INTEGRATED CIRCUIT FEATURES USING DOUBLE PATTERNING TECHNOLOGY

BACKGROUND

Double patterning is a technology developed for lithography to enhance the feature density. Typically, for forming features of integrated circuits on wafers, the lithography technology is used, which involves applying a photo resist, and defining features on the photo resist. The features in the patterned photo resist are first defined in a lithography mask, and are implemented either by the transparent portions or by the opaque portions in the lithography mask. The features in the patterned photo resist are then transferred to the manufactured features.

With the increasing down-scaling of integrated circuits, the optical proximity effect posts an increasingly greater problem. When two separate features are too close to each other, the optical proximity effect may cause the features to short to each other. To solve such a problem, double patterning technology is introduced. When the double patterning technology is used, the closely located features are separated to two photolithography masks of a same double-patterning mask set, with both masks used to expose the same photo resist, or used to pattern the same hard mask. In each of the masks, the distances between features are increased over the distances between features in the otherwise a single mask, and hence the optical proximity effect is reduced, or substantially eliminated.

The double patterning, however, also suffers from drawbacks. For example, when two features have their lengthwise directions aligned to a same straight line, and the line ends of the features face each other, it is difficult to control the uniformity of the line end space due to the proximity effect and overlay variation. The line widths of the features are also difficult to control, especially when there are other features close to these two features.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Features with fine line space and the methods of forming the same are provided in accordance with various exemplary embodiments. The intermediate stages of forming the features are illustrated in accordance with some exemplary embodiments. The variations of the embodiments are discussed. Throughout the various views and illustrative embodiments, like reference numbers are used to designate like elements.

Figure 1A:
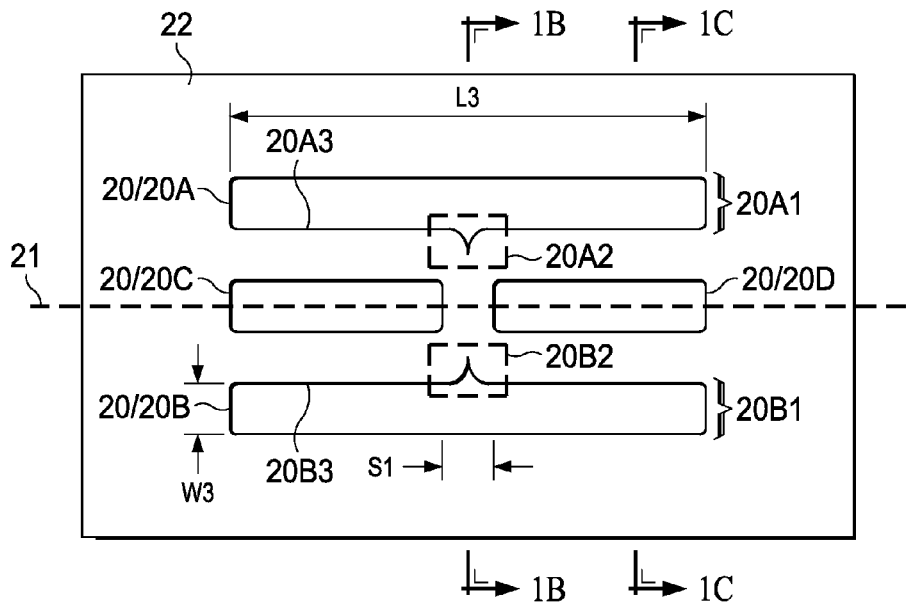
FIGS. 1A through 1C illustrate a top view and cross-sectional views of features formed in a base material; and The FIG. 2A-FIG. 3B, FIG. 4A-FIG. 4C, FIG. 5A-FIG. 5D, FIG. 6A-FIG. 6C, FIG. 7A-FIG. 7C, FIG. 8A-FIG. 9D, and FIG. 10A-FIG. 12C are top views, perspective views, and cross-sectional views of intermediate stages in the manufacturing of features in a base material in accordance with some exemplary embodiments.

FIG. 1A illustrates a top view of features 20 formed in base material 22. In accordance with some embodiments, base material 22 is a dielectric material such as a low-k dielectric material with a k value lower than 3.8, an extreme low-k dielectric material with a k value lower than about 2.5, or a ultra low-k dielectric material with a k value lower than about 2.0. Base material 22 may also be a semiconductor material such as silicon, a conductive material such as a metal or a metal alloy. Base material 22 may also comprise Phospho-Silicate glass (PSG), Boro-Silicate Glass (BSG), Boron-Doped Phospho-Silicate Glass (BPSG), Tetraethyl Orthosilicate (TEOS) oxide, TiN, SiOC, or any other material in which features of different materials can be formed. Base material 22 may function as an Inter-Metal Dielectric (IMD) or an Inter-Layer Dielectric (ILD) layer.

Features 20, on the other hand, may be conductive features such as metal lines and/or vias, contact plugs, dielectric regions such as Shallow Trench Isolation (STI) regions, poly-silicon regions, crystalline silicon regions, or the like. Features 20 and base material 22 may be formed using Chemical Vapor Deposition (CVD), Plasma Enhanced CVD (PECVD), Physical Vapor Deposition (PVD), or the like. In some exemplary embodiments, base material 22 is a dielectric layer (for example, an IMD), and features 20 are metal lines. In alternative embodiments, base material 22 is an ILD, and features 20 are contact plugs.

As shown in FIG. 1A, features 20 include 20A, 20B, 20C, and 20D. Features 20A and 20B are parallel to each other, and are closely located. Features 20C and 20D are located between features 20A and 20B. The lengthwise directions (and the lengthwise center lines) of features 20C and 20D are aligned to the same straight line 21. In accordance with some embodiments, the left ends of features 20A and 20B and the left ends of features 20C and 20D are aligned, as shown in FIG. 1A. In alternative embodiments, the left ends of features 20A and 20B extend farther to the left than the left end of feature 20C. Similarly, the right ends of features 20A and 20B and the right ends of features 20C and 20D may be aligned, as shown in FIG. 1A, or the right ends of features 20A and 20B may be extend farther to the right than the right end of feature 20D. In accordance with some embodiments, line end space S1 between features 20C and 20D is between about 5 nm and about 100 nm. It is appreciated, however, that the values recited throughout the description are merely examples, and may be changed to different values. In the following discussion, it is assumed that features 20A and 20B have the same lengths and widths, and features 20C and 20D have the same lengths and widths, although their lengths and widths may be different from each other.

Figure 1B:
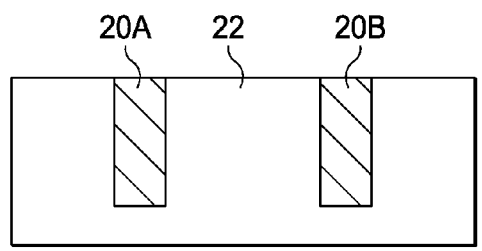
Figure 1C:
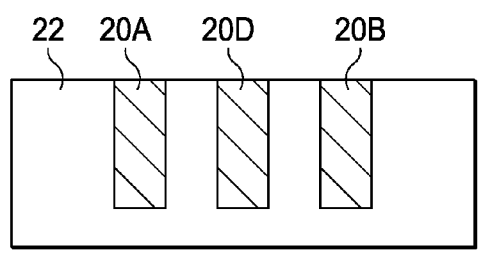

FIGS. 1B and 1C are cross-sectional views of the structure shown in FIG. 1A, wherein the cross-sectional views are obtained from the vertical plane containing lines A-A and B-B, respectively, in FIG. 1A. As shown in FIGS. 1B and 1C, features 20A, 20B, 20D (and 20C in FIG. 1A) extend into base material 22. Although FIGS. 1B and 1C illustrate that features 20 extend to an intermediate level that is between the top surface and the bottom surface of base material 22, features 20 may also extend from the top surface to the bottom surface of base material 22, wherein an additional layer (not shown) may be underlying base material 22 in these embodiments.

FIGS. 2A through 12C illustrate the top views and cross-sectional views of intermediate stages in the manufacturing of features 20 in base material 22 in accordance with some exemplary embodiments. Referring to FIGS. 2A and 2B, which include a perspective view and a cross-sectional view, respectively, hard masks 24 and 26 are formed over base material 22. In accordance with some embodiments, each of hard masks 24 and 26 comprises a material selected from Si, SiO, SiOC, SiN, metals (such as copper, tungsten, titanium, tantalum, and aluminum), or metal alloys. Each of hard masks 24 and 26 may also comprise a material selected from metal oxides, metal nitrides, and metal oxy-nitrides such as AlO, AlN, AlON, TaN, TiN, and TiO. Although hard masks 24 and 26 may be selected from the same group of candidate materials, hard masks 24 and 26 are formed of different materials so that they have a desirable high etching selectivity, and hence when hard mask 26 is etched, hard mask 24 may be used as an etch stop layer.

The subsequently performed steps shown in FIGS. 3A through 6C are used to form an I-shaped opening in hard mask 26. Referring to FIGS. 3A and 3B, which include a perspective view and a cross-sectional view, respectively, photo resist 28 is formed over hard mask 26, for example, using spin coating. Photo resist 28 is then patterned to form opening 30, through which hard mask 26 is exposed. Length L1 of opening 30 may be in the range between about 30 nm and about 1,000 nm, and width W1 of opening 30 may be in the range between about 5 nm and about 100 nm. Length L1 and width W1, however, is related to the technology generation for forming the integrated circuits, and may have different values.

Figure 4A:
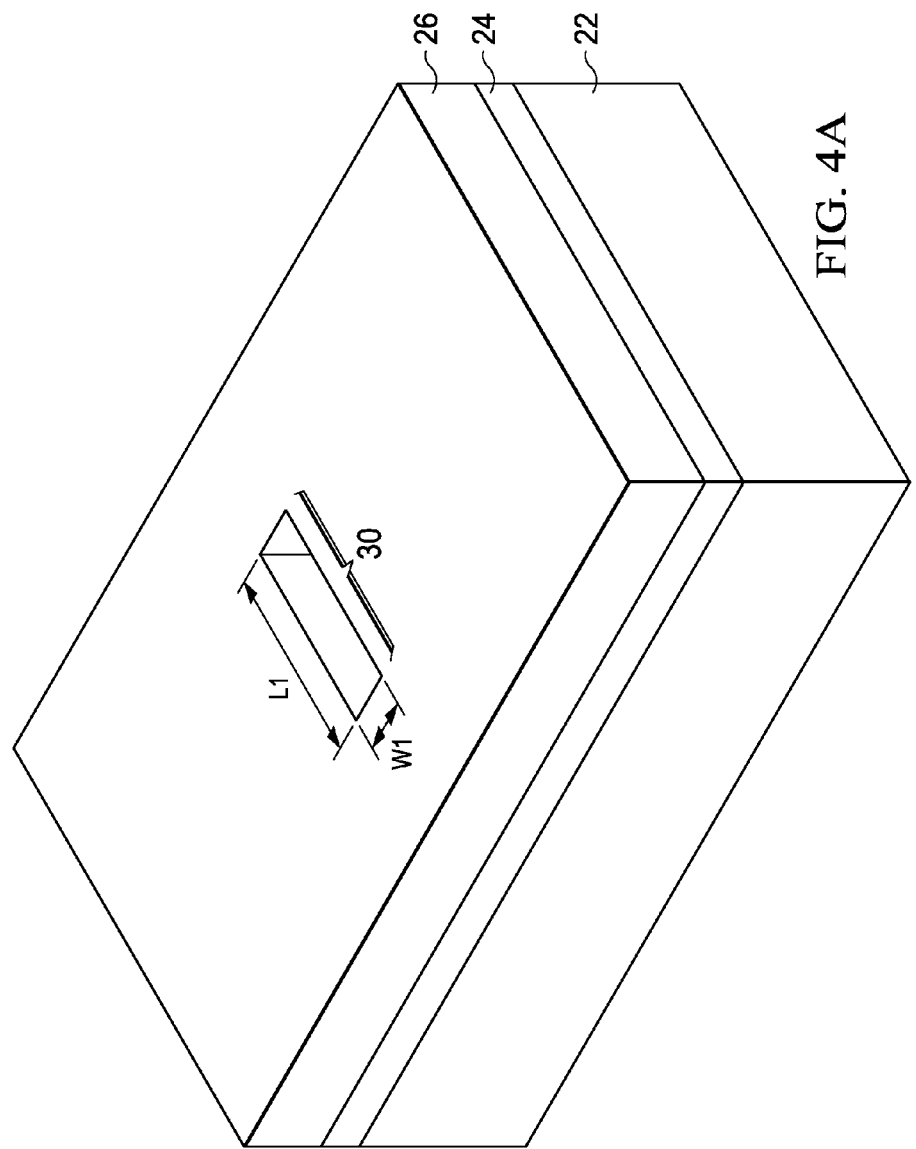
Figure 4B:
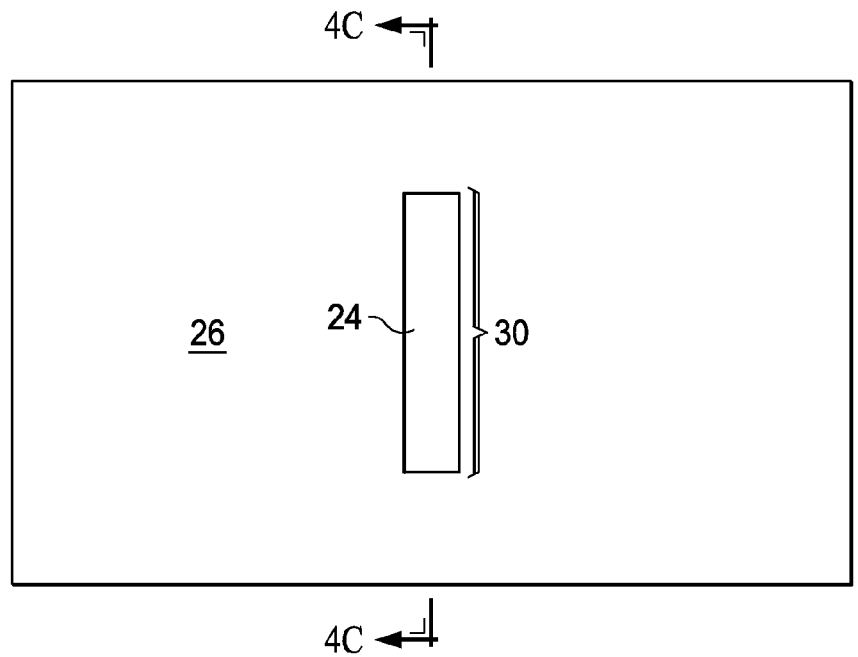
Figure 4C:
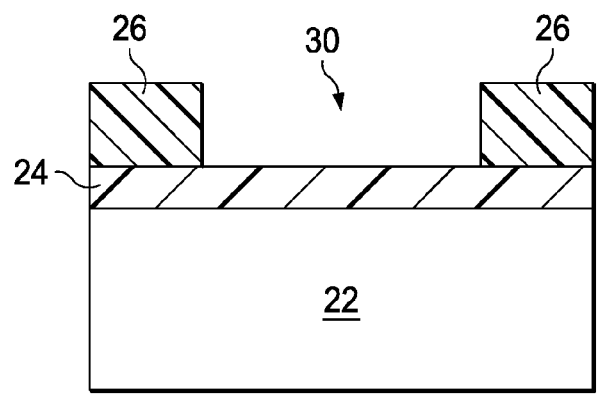

The exposed portion of hard mask 26 is then etched using the patterned photo resist 28 as an etching mask, so that opening 30 extend into hard mask 26. Hard mask 24 is used as an etch stop layer during the etching. Photo resist 28 is then removed. The resulting structure is shown in FIGS. 4A, 4B, and 4C, which illustrate that the pattern of opening 30 is transferred into hard mask 26. FIG. 4B is a top view of the structure in FIG. 4A. FIG. 4C is a cross-sectional view of the structure in FIGS. 4A and 4B, wherein the cross-sectional view is obtained from the plane containing line A-A in FIG. 4B.

Figure 5A:
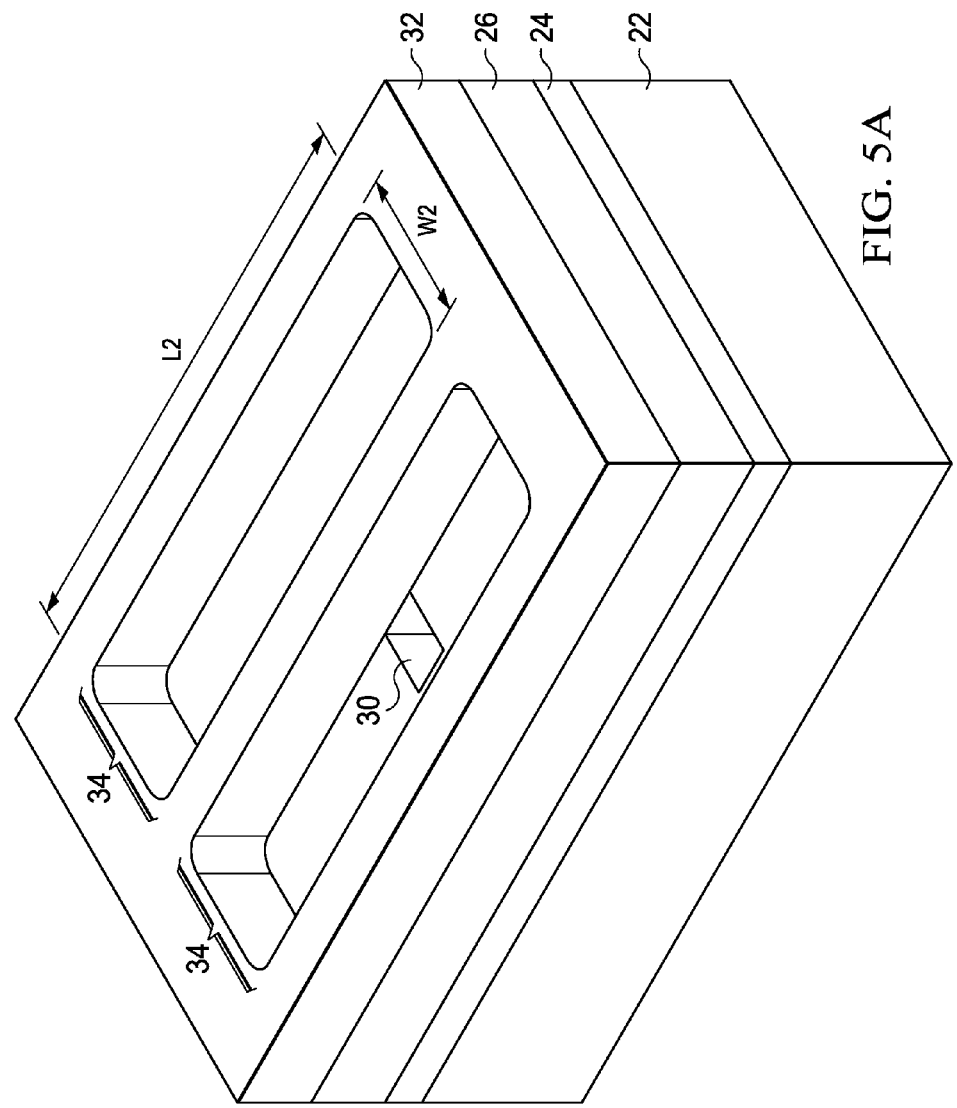
Figure 5B:
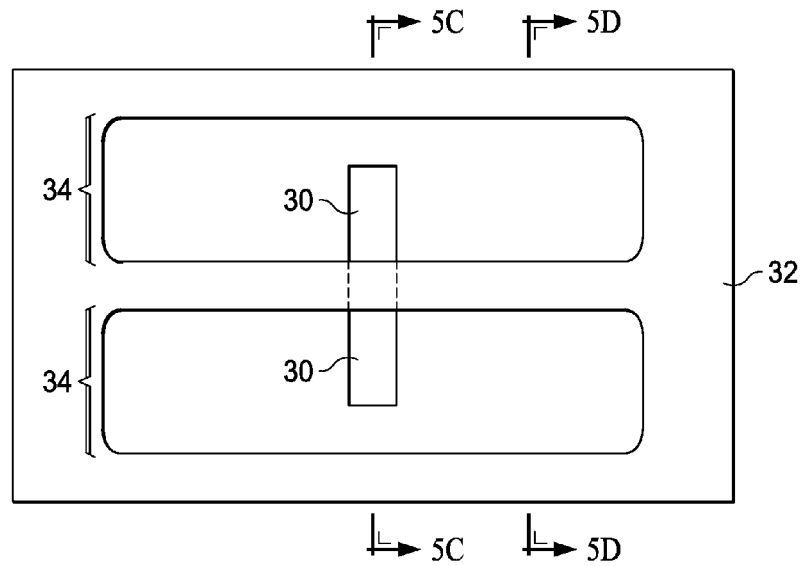
Figure 5C:
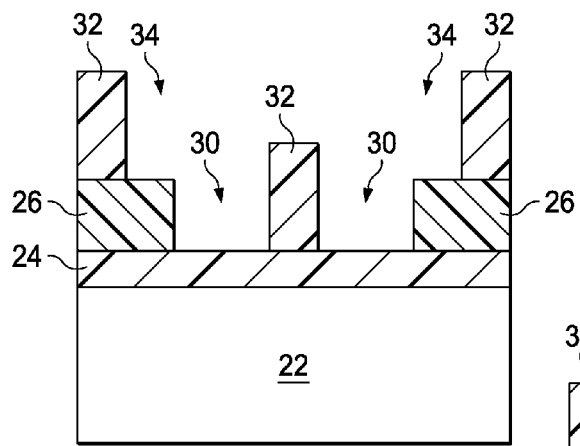
Figure 5D:
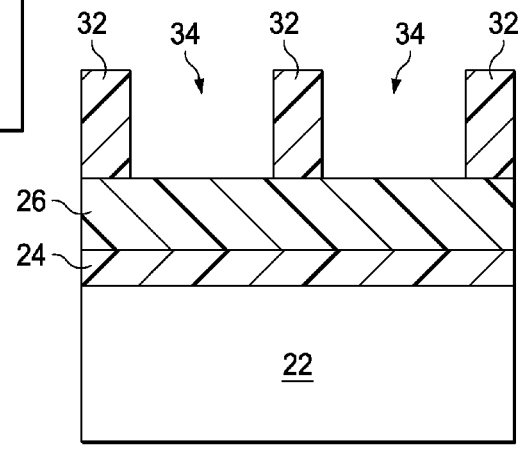

Next, referring to FIGS. 5A, 5B, 5C, and 5D, photo resist 32 is formed and patterned, forming openings 34 in photo resist 32. FIGS. 5A and 5B illustrate a view and a top view, respectively. The cross-sectional views in FIGS. 5C and 5D are obtained from the planes containing lines A-A and B-B, respectively, in FIG. 5B. As shown in FIGS. 5A and 5B, openings 34 have lengthwise directions parallel to each other. Length L2 and width W2 of openings 34 are selected to be greater than the length L3 and the width W3, respectively, of features 20A and 20B (FIG. 1A), by a difference, wherein the details of the difference is discussed in detailed in subsequent paragraphs.

As shown in FIGS. 5A and 5B, photo resist 32 covers and fills a middle portion of opening 30, while the opposite end portions of opening 30 are not covered, and are exposed to opening 34, as also shown in FIG. 5C.

Figure 6A:
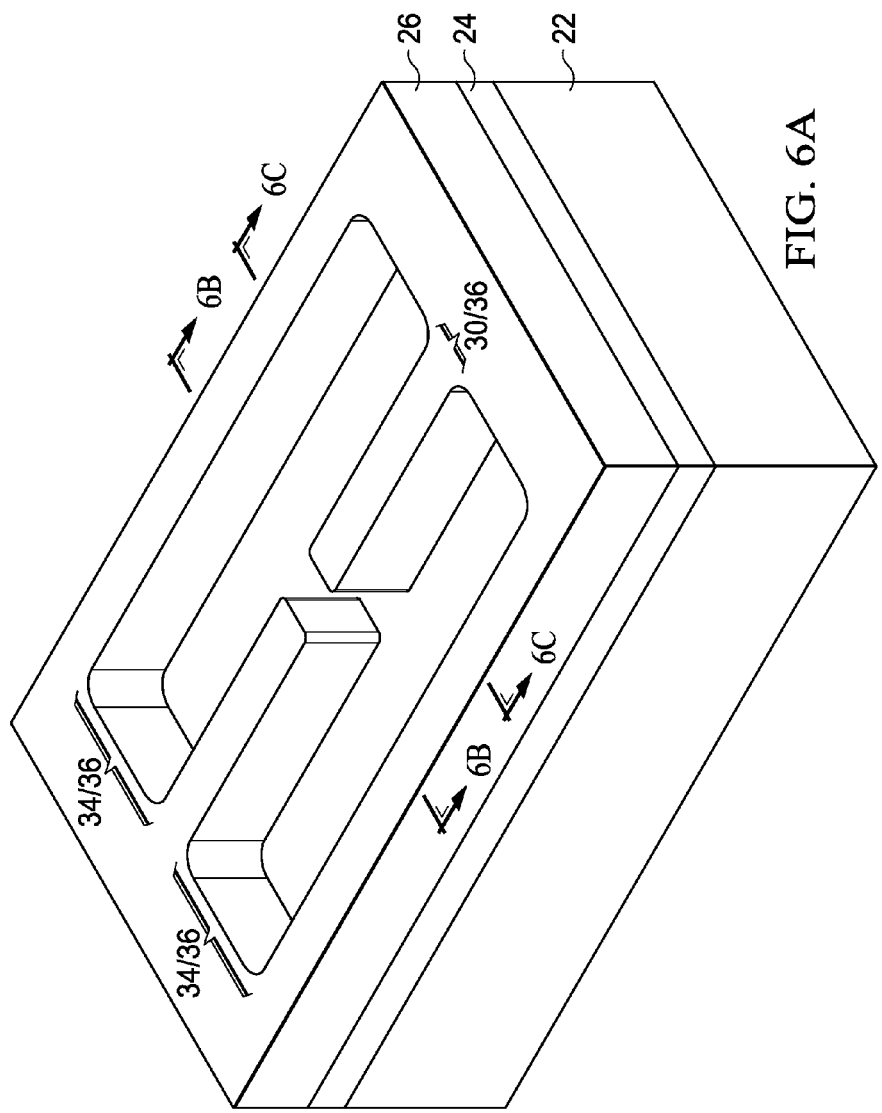
Figure 6B:
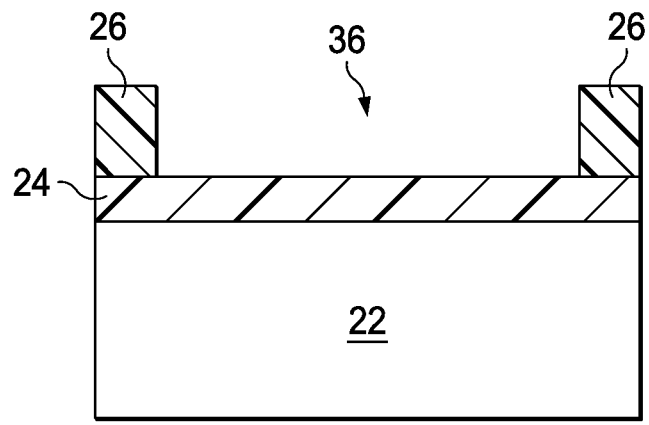
Figure 6C:
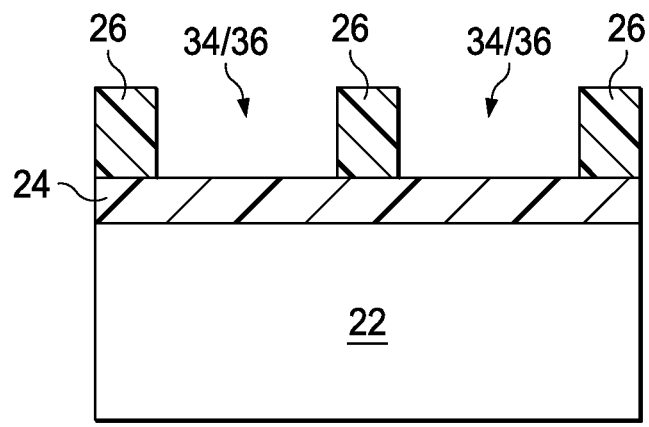

Next, hard mask 26 is further etched. In the etching, photo resist 32 is used as an etching mask, and hard mask 24 is used as an etch stop layer, so that openings 34 extend into hard mask 26. Photo resist 32 is then removed. The resulting structures are shown in FIGS. 6A, 6B, and 6C, which illustrate a top view and two cross-sectional views. FIG. 6A illustrates a perspective view. The cross-sectional views in FIGS. 6B and 6C are obtained from the planes containing lines A-A and B-B, respectively, in FIG. 6A. Openings 30 and 34 in combination form an I-shaped opening, which is sometimes referred to as opening 36, as shown in FIG. 6A. I-shaped opening 36 include two parallel openings 34, with opening 30 connecting parallel openings 34.

Figure 7A:
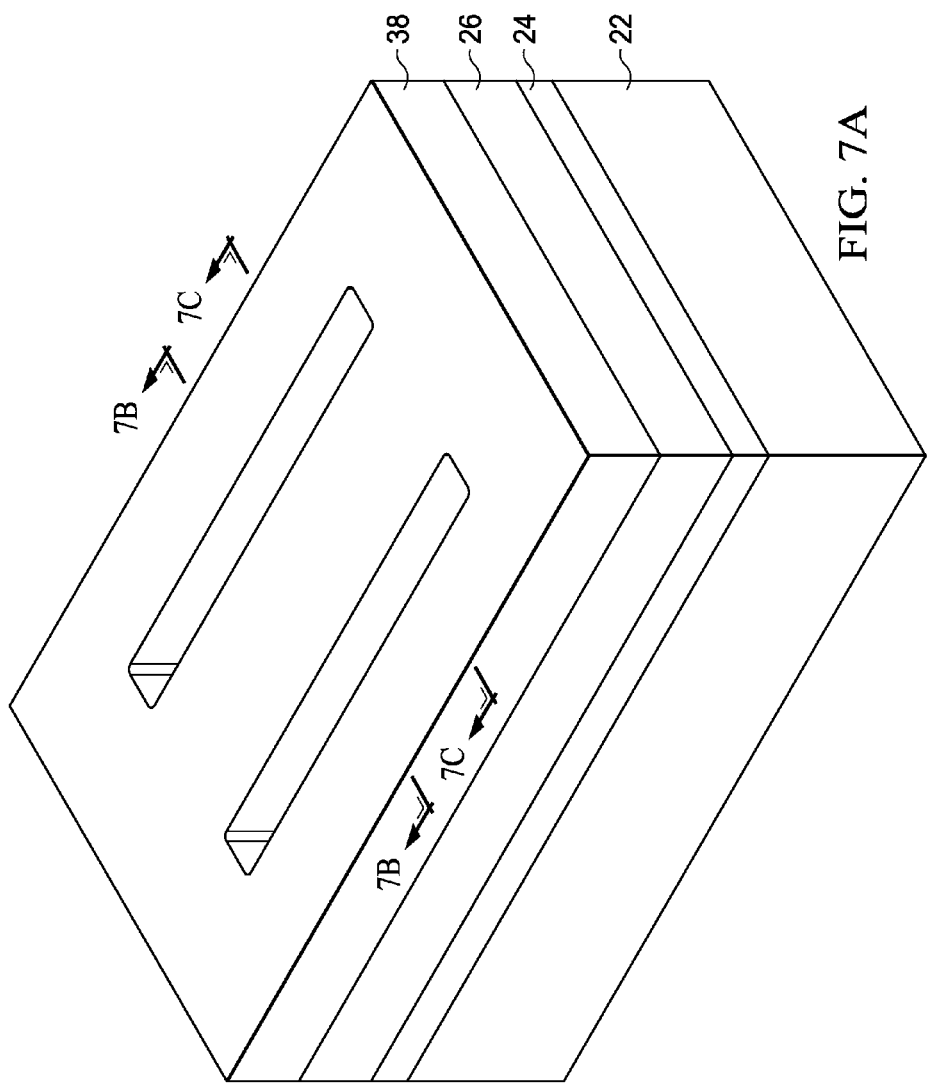
Figure 7B:
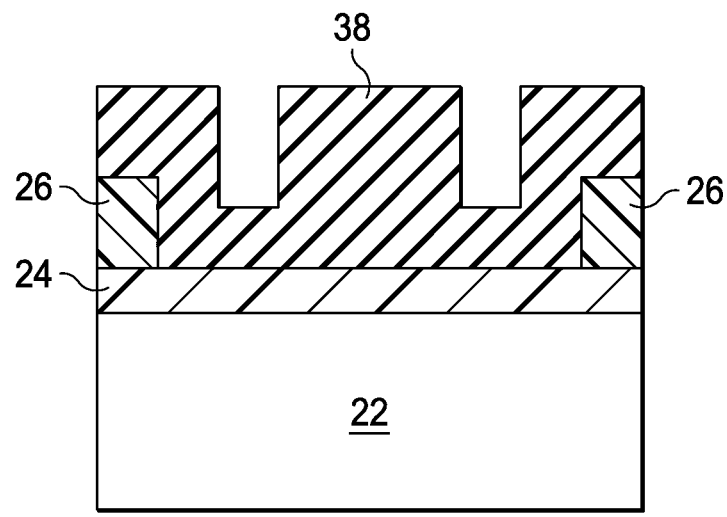
Figure 7C:
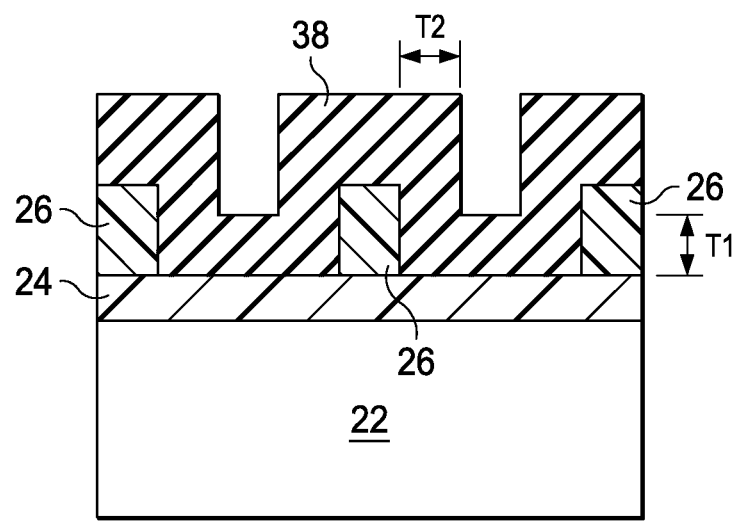

Referring to FIGS. 7A, 7B, and 7C, spacer layer 38 is blanket formed over the structure in FIGS. 6A through 6C. FIG. 7A illustrates a perspective view. The cross-sectional views in FIGS. 7B and 7C are obtained from the planes containing lines A-A and B-B, respectively, in FIG. 7A. The planes of FIGS. 7B and 7C are also the same planes in FIGS. 6B and 6C, respectively. The material of spacer layer 38 may be selected from the same group of candidate materials for forming hard masks 24 and 26. Alternatively, the material of spacer layer 38 may be selected from a different group of materials. For example, the material of spacer layer 38 may be selected from Si, SiO, SiN, metals and metal alloys. The material of spacer layer 38 may also be selected from metal oxides, metal nitrides, and metal oxy-nitrides such as AlO, AlN, AlON, TaN, TiN, TiO, or the like. Furthermore, although may be selected from the same pool, the material of spacer layer 38 is different from the materials of hard masks 24 and 26, so that they may have a desirable etching selectivity, and hence when spacer layer 38 is etched, hard masks 24 and 26 are not be etched if desirable, and hard masks 24 and 26 are used as an etch stop layer when spacer layer 38 is etched.

As shown in FIGS. 7A, 7B, and 7C, spacer layer 38 may be formed as a conformal layer, with the thickness T1 (FIG. 7C) of its horizontal portions and the thickness T2 of its vertical portions close to each other, for example, with a difference smaller than about 20 percent of thickness T1.

Figure 8A:
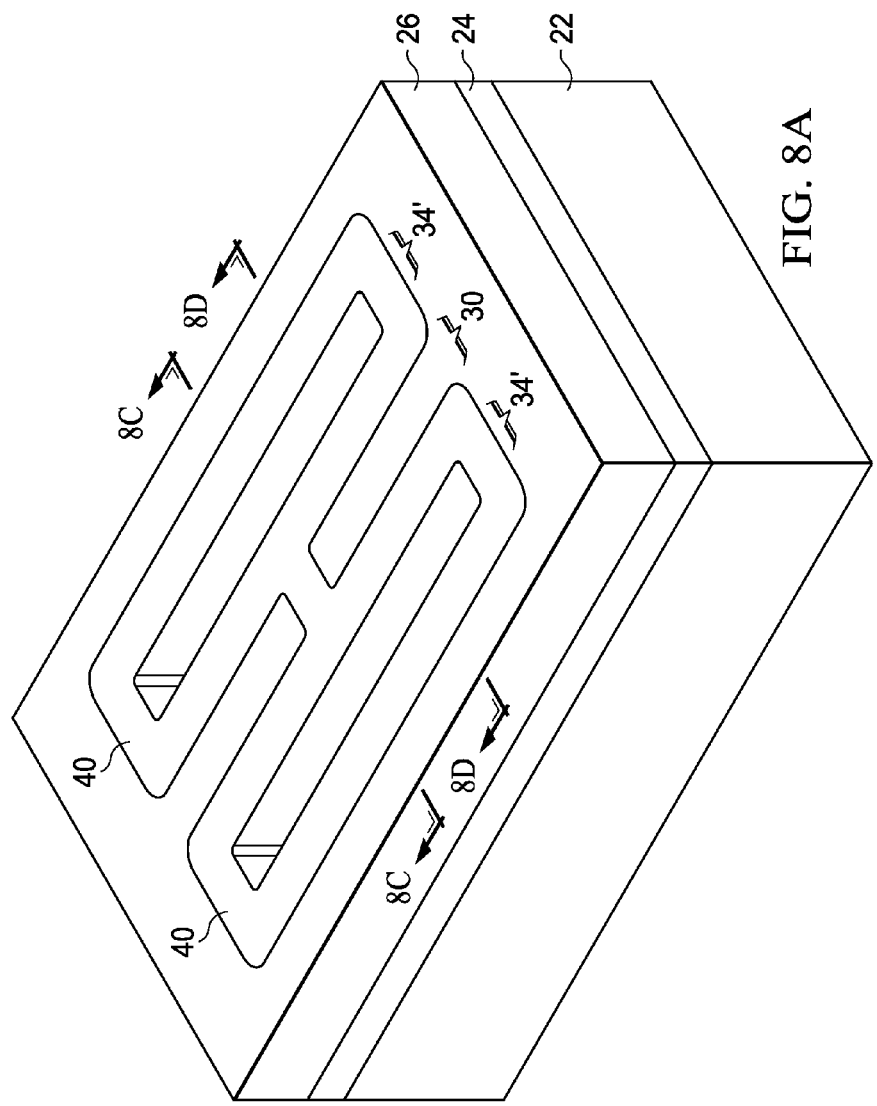
Figure 8B:
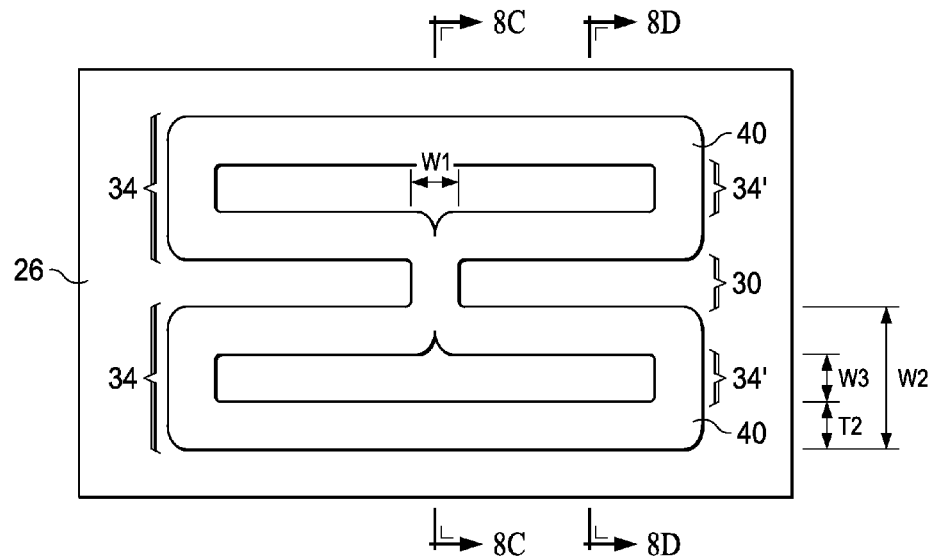
Figure 8C:
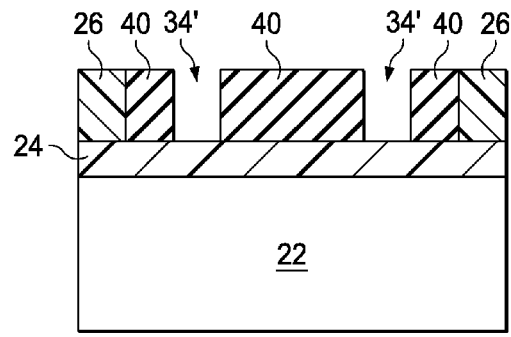
Figure 8D:
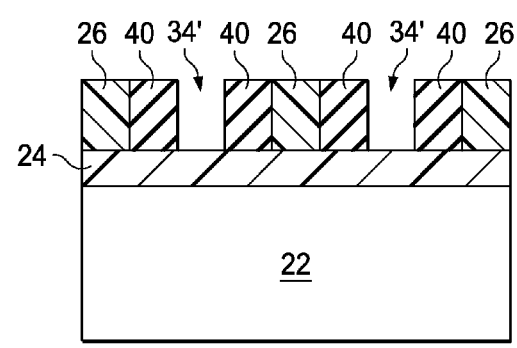

An anisotropic etching is then performed to remove the horizontal portions of spacer layer 38, while the vertical portions of spacer layers 38 remain, and are referred to as spacers 40 hereinafter. In alternative embodiments, a Chemical Mechanical Polish (CMP) is performed to remove portions of spacer layer 38 over hard mask layer 26. The result structure is shown in FIGS. 8A, 8B, 8C, and 8D. FIGS. 8A and 8B illustrate a perspective view and a top view, respectively. The cross-sectional views in FIGS. 8C and 8D are obtained from the planes containing lines A-A and B-B, respectively, in FIG. 8B. The remaining vertical portions of spacer layer 38 form spacers 40, as shown in FIGS. 8A, 8B, 8C, and 8D.

When spacer layer 38 (FIG. 7C) is formed, thickness T2 of spacer layer 38 is also equal to or greater than a half of width W1 (FIG. 8B) of opening 30. As a result, the sidewall (vertical) portions of spacer layer 38, which sidewall portions are on opposite sidewalls of opening 30, merge with each other, as shown in FIGS. 8A and 8B. Hence, spacers 40 fill an entirety of opening 30. On the other hand, as shown in FIG. 8B, widths W2 of openings 34 are greater than two times thickness T2, so that each of openings 34 has a center portion 34' remaining not filled by spacers 40. Hard mask 24 is exposed through openings 34'. Width W3 of the openings 34' is the desirable width W3 of features 20A and 20B, as shown in FIG. 1A. Similarly, length L3 of openings 34' is the desirable length of features 20A and 20B, as shown in FIG. 1A. Accordingly, length L3 and width W3 may be achieved by adjusting length L2 and W2 (FIG. 5A) and thickness T2 (FIG. 7C).

Figure 9A:
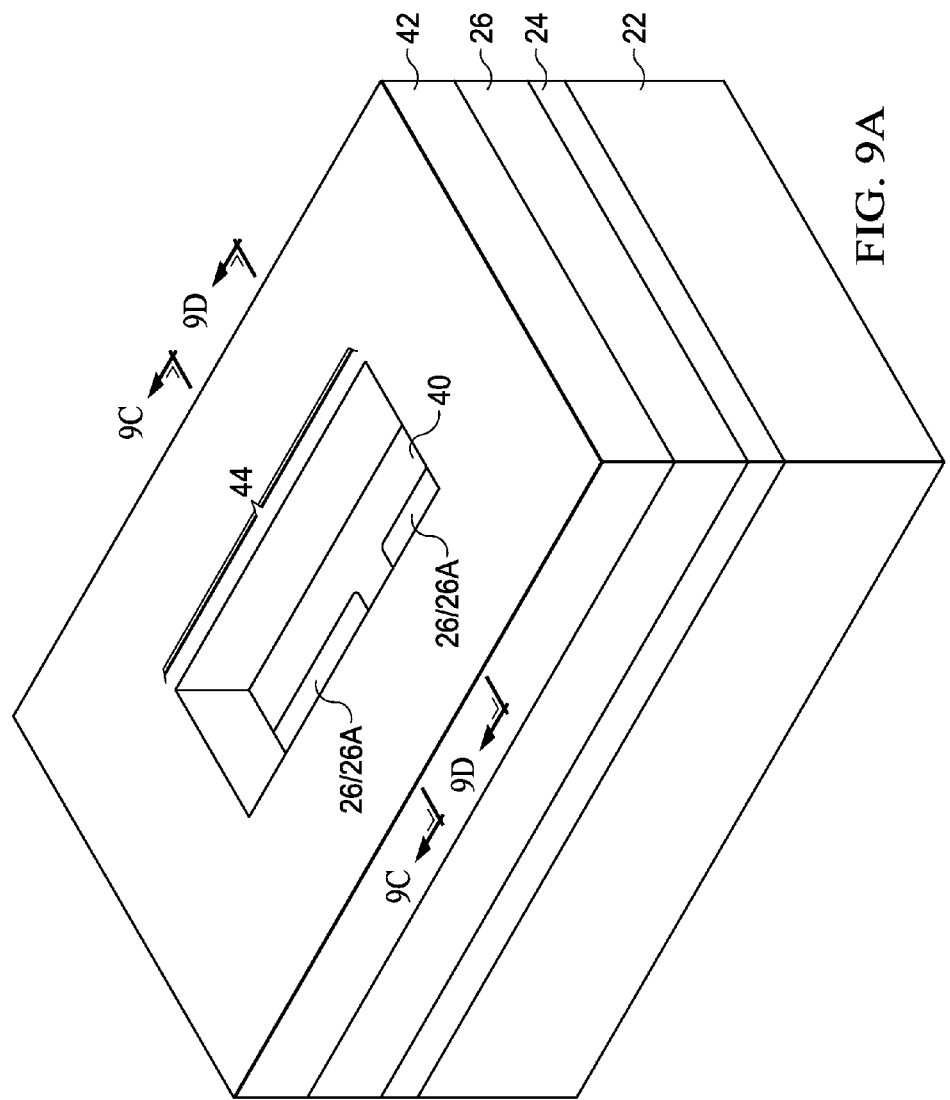
Figure 9B:
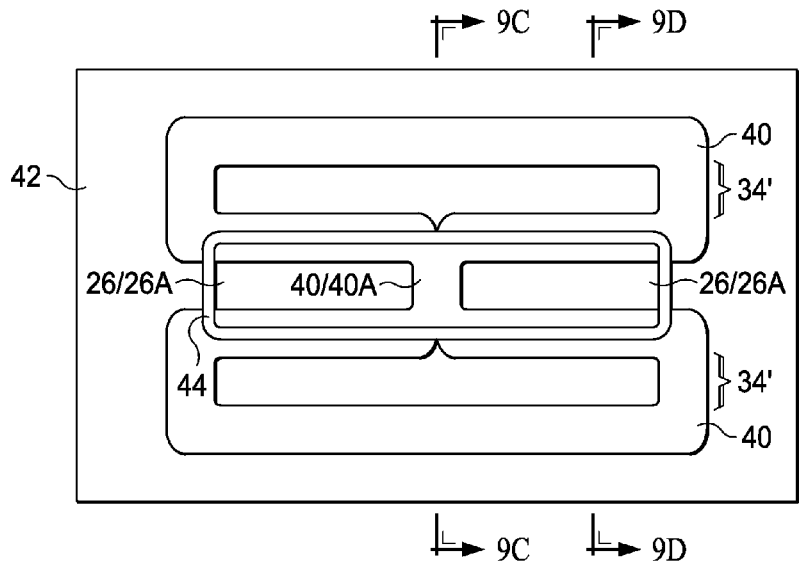
Figure 9C:
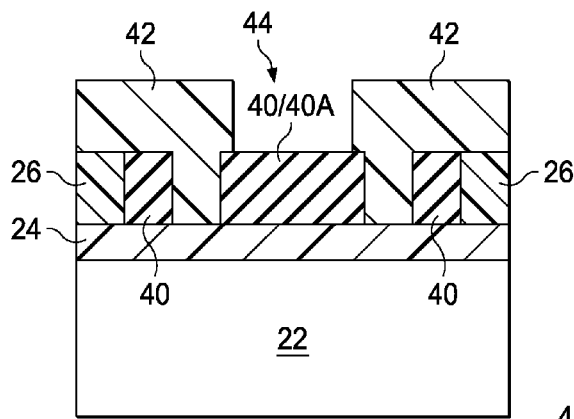
Figure 9D:
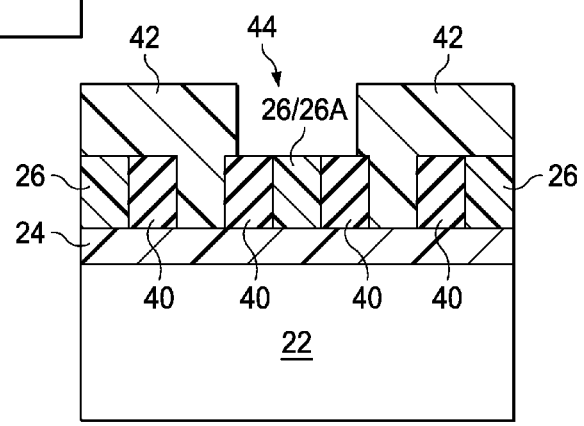

FIGS. 9A through 10C illustrate the steps for defining the size and locations of features 20C and 20D (FIG. 1). Referring to FIGS. 9A, 9B, 9C, and 9D, photo resist 42 is formed and patterned, forming opening 44 in photo resist 42. FIGS. 9A and 9B illustrate a perspective view and a top view, respectively. The cross-sectional views in FIGS. 9C and 9D are obtained from the planes containing lines A-A and B-B, respectively, in FIG. 9B. As shown in FIG. 9B, portion 40A of spacers 40, which portion 40A is filled into opening 30 (FIG. 5B) is exposed through opening 44. As shown in FIG. 9A, some portions 26A of hard mask 26, which portions 26A are between openings 34' (FIG. 9B), are also exposed to opening 44.

Figure 10A:
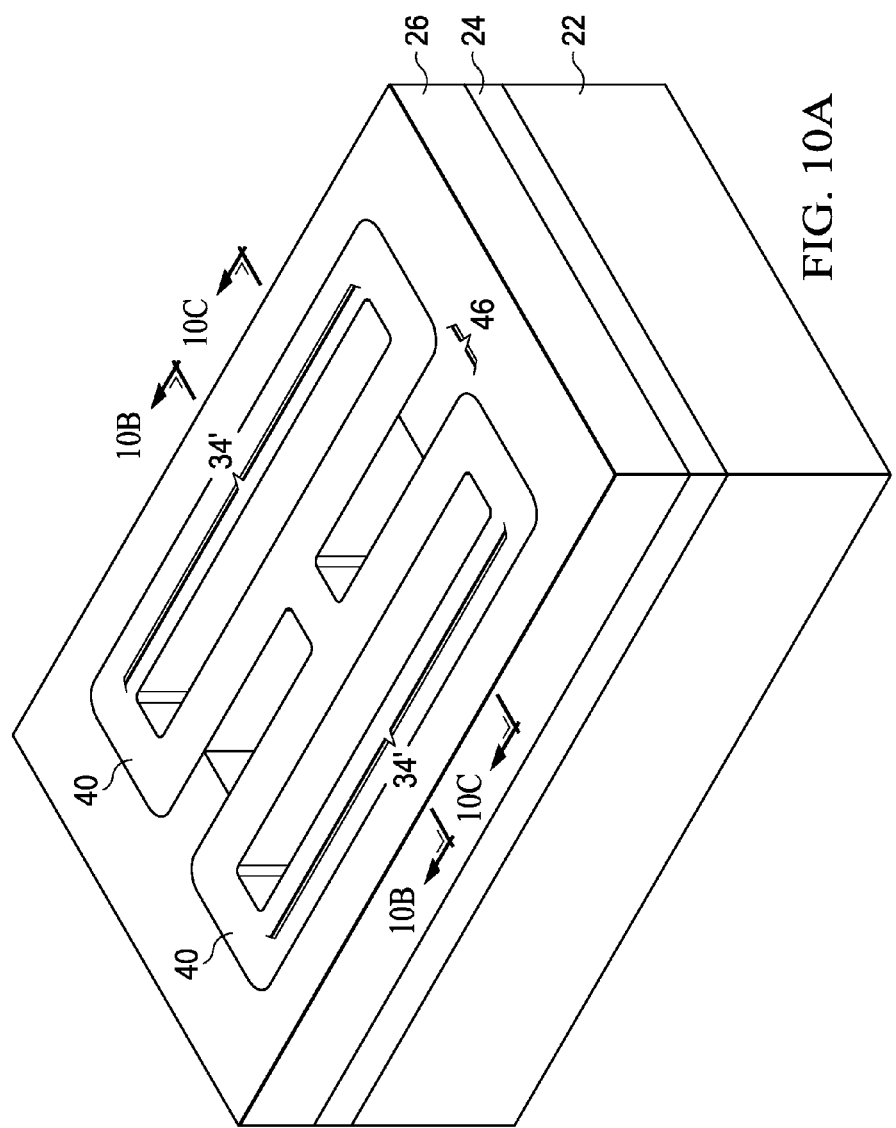
Figure 10B:
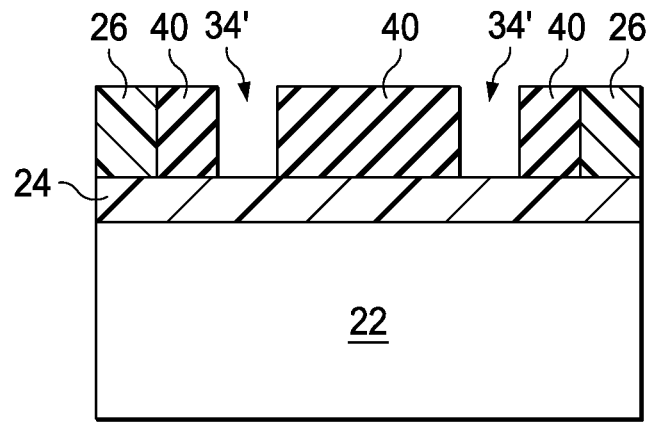
Figure 10C:
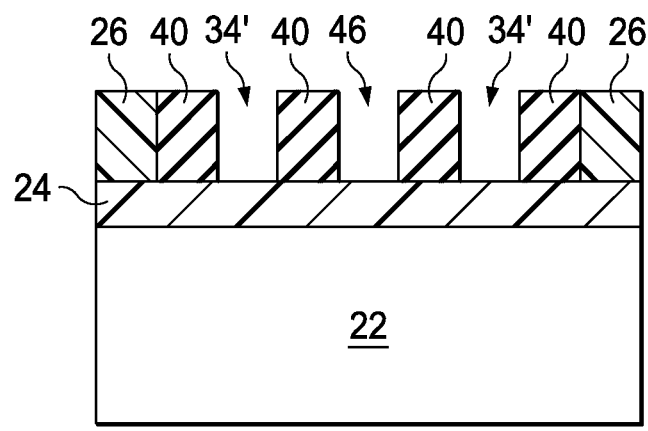

Next, the exposed hard mask portions 26A are etched using photo resist 42 as an etching mask. The etching also stops on hard mask 24 and spacers 40. Photo resist 42 is then removed. FIG. 10A illustrates a perspective view of the resulting structure. The cross-sectional views in FIGS. 10B and 10C are obtained from the planes containing lines A-A and B-B, respectively, in FIG. 10A. As a result of the etching, openings 46 are formed in, and surrounded by, hard mask 26 and spacers 40. Furthermore, as shown in FIG. 10A, there exist two openings 34', and two openings 46 between openings 34', wherein openings 34' and openings 46 in combination have the same layout and sizes as features 20 in FIG. 1A.

Figure 11A:
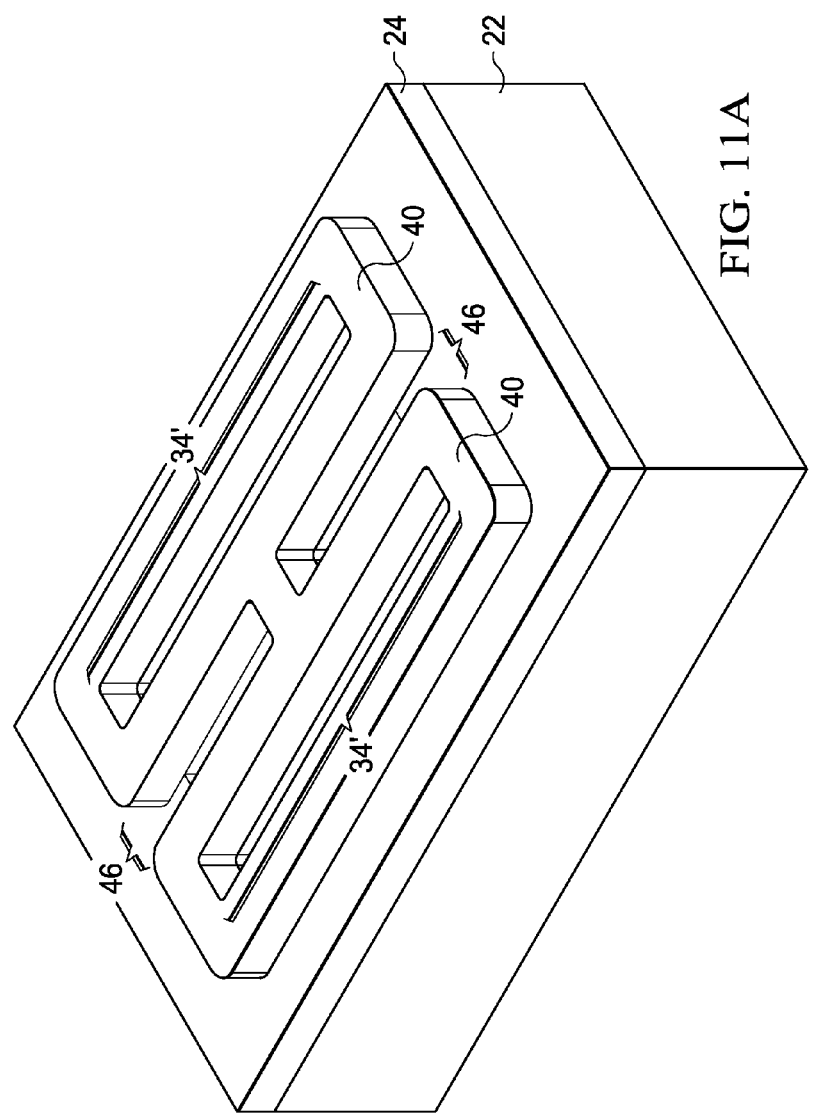
Figure 11B:
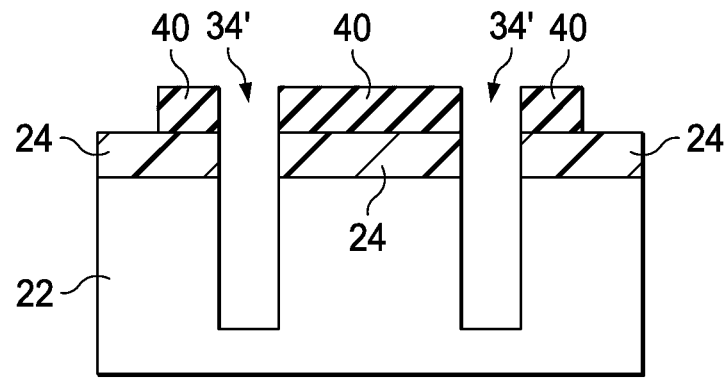
Figure 11C:
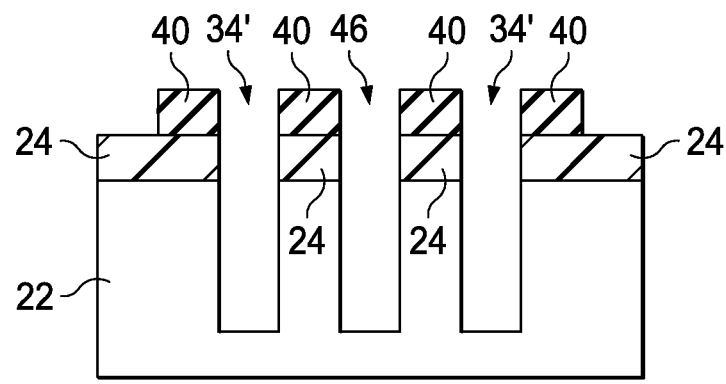

FIGS. 11A, 11B, and 11C illustrate the transferring of the patterns of openings 34' and openings 46 to underlying hard mask 24 and base material 22. FIGS. 11A and 11B illustrate a perspective view and a top view, respectively, of the resulting structure. The cross-sectional views in FIGS. 11C and 11D are obtained from the planes containing lines A-A and B-B, respectively, in FIG. 11B. First, hard mask 26 and spacers 40 in FIGS. 10A, 10B, and 10C are in combination used as an etching mask to etch the underlying hard mask 24, so that openings 34' and 46 extend down into hard mask 24. Hard mask 26 may then be removed in some embodiments. In alternative embodiments, hard mask 26 may be left un-removed.

Figure 12A:
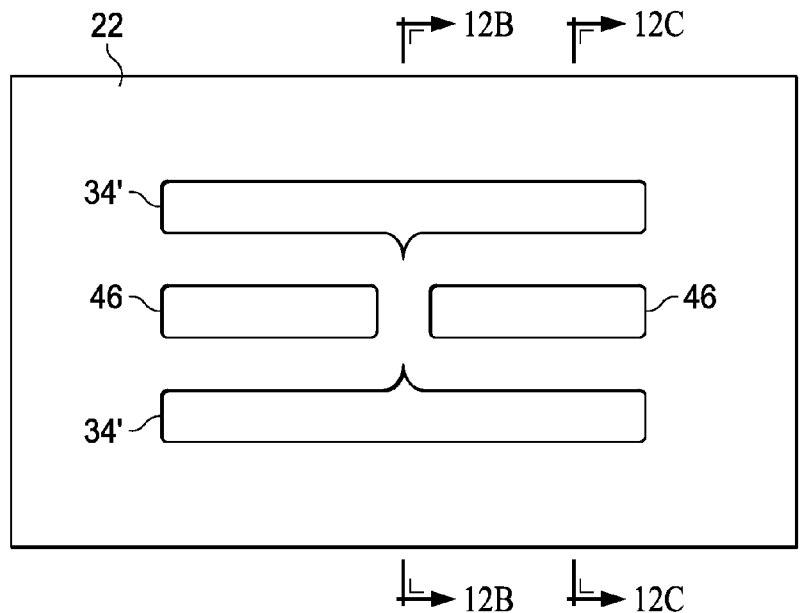
Figure 12B:
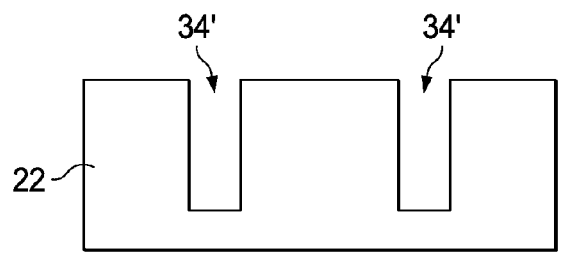
Figure 12C:
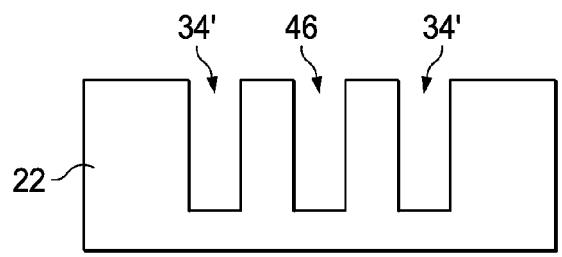

As also shown in FIGS. 11A, 11B, and 11C, hard mask 24 (and possibly the un-removed spacers 40) is used as an etching mask to etch base material 22, so that openings 34' and 46 extend into base material 22. Next, hard mask 24 and spacers 40 are removed, and the resulting structure is shown in FIGS. 12A, 12B, and 12C, which include a top view and cross-sectional views. In a subsequent step, openings 34' and 46 are filled with features 20, and the resulting structure is shown in FIGS. 1A, 1B, and 1C. The formation of features 20A, 20B, 20C, and 20D may include blanket depositing a material that is the same as the material of features 20, and performing a planarization such as a Chemical Mechanical Polish (CMP) to remove excess portions of the material over base material 22. The remaining un-removed material form features 20. Features 20A and 20B (FIGS. 1A, 1B, and 1C) fill openings 34' (FIG. 12A), and features 20C and 20D (FIGS. 1A, 1B, and 1C) fill openings 46 (FIG. 12A).

Referring to FIG. 1A, features 20A and 20B comprise major portion 20A1 and 20B1, respectively, which may have rectangular shapes. The edges 20A3 and 20B3 of the major portions are parallel to each other, and are parallel to straight line 21. Features 20A and 20B further include tip portions 20A2 and 20B2, respectively, which are connected to the respective major portions 20A1 and 20B1. Tip portions 20A2 and 20B2 are the result of the shape of spacers 40 (FIG. 8B). Referring back to FIG. 1A, tip portions 20A2 and 20B2 are aligned to the center of the space between the ends of features 20C and 20D. Each of the tip portions 20A2 and 20B2 has gradually and continuously reduced widths, wherein the widths of the tip portions are measured in a direction parallel to edges 20A3 and 20B3.

The embodiments of the present disclosure have some advantageous features. The line end space of features 20C and 20D are defined by the step in FIG. 4A, and features 20C and 20D are formed simultaneously. Therefore, there is no double patterning overlay issue. The variation in the line end space is thus minimized. Furthermore, the line end space of features 20C and 20D may be very small since is equal to the minimum size defined by the respective lithography technology. As a comparison, in conventional methods, since features 20C and 20D are very close to each other, double patterning was used to form features 20C and 20D. Furthermore, in conventional methods, since features 20C and 20D are close to features 20A and 20B, sometimes triple patterning is needed. In the triple patterning, features 20A and 20B are formed using a first photolithography process, feature 20C is formed using a second photolithography process, and feature 20D is formed using a third photolithography process. Therefore, severe overlay issue may occur in the conventional triple patterning technology.

In accordance with some embodiments, a method includes forming a hard mask over a base material, and forming an I-shaped first opening in the hard mask. The first opening includes two parallel portions and a connecting portion interconnecting the two parallel portions. Spacers are formed on sidewalls of the first opening. The spacers fill an entirety of the connecting portion, wherein a center portion of each of the two parallel portions is unfilled by the spacers. The hard mask is etched to remove a portion of the hard mask and to form a second opening, wherein the second opening is between the two parallel portions of the first opening. The second opening is spaced apart from the two parallel portions of the first opening by the spacers. The first opening and the second opening are then extended down into the base material.

In accordance with other embodiments, a method includes forming a first hard mask over a base material, forming a second hard mask over the first hard mask, performing a first etching step on the second hard mask to form a first opening, and performing a second etching step on the second hard mask to form a second opening and a third opening parallel to each other. Opposite ends of the first opening are connected to the second opening and the third opening to form an I-shaped opening. A blanket spacer layer is formed over the second hard mask, wherein the blanket spacer layer extends into the I-shaped opening. Portions of the blanket spacer layer over the second hard mask are removed, with remaining portions of the blanket spacer layer forming spacers. The spacers comprise a connecting portion filling an entirety of a portion of the first opening that connects the second opening and the third opening. Center portions of the second opening and the third opening are unfilled by the spacers. The second hard mask is then etched to remove portions of the second hard mask to form a fourth opening and a fifth opening in the second hard mask. The fourth opening and the fifth opening are on opposite sides of the connecting portion of the spacers, and are between the second opening and the third opening.

In accordance with yet other embodiments, an integrated circuit structure includes a base material, and a first feature and a second feature extending into the base material. The first feature and the second feature have lengthwise directions aligned to a straight line. The first feature and the second feature are spaced apart from each other by an intermediate portion of the base material. A third feature extends into the base material, wherein the first feature, the second feature, and the third feature are formed of a same material. The third feature includes a major portion having a straight edge parallel to the lengthwise directions of the first feature and the second feature, and a tip portion connected to the major portion, wherein the tip portion is aligned to a middle line of the intermediate portion of the base material.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a first hard mask over a base material;
    forming a first opening in the first hard mask, wherein the first opening has an I-shape and comprises:
        two parallel portions; and
        a connecting portion interconnecting the two parallel portions;
    forming spacers on sidewalls of the first opening, wherein the spacers fill an entirety of the connecting portion, and wherein a center portion of each of the two parallel portions is unfilled by the spacers;
    etching the first hard mask to remove a portion of the first hard mask and to form a second opening in the first hard mask, the second opening being different from the first opening, wherein the second opening is between the two parallel portions of the first opening, and wherein the second opening is spaced apart from the two parallel portions of the first opening by the spacers; and
    extending the first opening and the second opening into the base material.

2. The method of claim 1 further comprising:
    etching a second hard mask underlying the first hard mask to extend the first opening and the second opening into the second hard mask, wherein the base material is etched using the second hard mask as an etching mask.

3. The method of claim 1 further comprising, after the first opening and the second opening are formed, filling the first opening and the second opening with a material different from the base material.

4. The method of claim 3 further comprising, before the filling the first opening and the second opening, removing the spacers.

5. The method of claim 1, wherein the forming the spacers comprises:
    forming a spacer layer having a thickness equal to or greater than a half of a width of the connecting portion of the first opening; and
    performing an anisotropic etching on the spacer layer, wherein remaining portions of the spacer layer not removed by the anisotropic etching are the spacers.

6. The method of claim 1 further comprising, at a same time the second opening is formed in the first hard mask, simultaneously etching the first hard mask to form a third opening in the first hard mask, wherein the third opening and the second opening are on opposite sides of the connecting portion of the first opening.

7. The method of claim 1, wherein the forming the first opening in the first hard mask comprises:
    forming and patterning a first photo resist over the first hard mask;
    etching the first hard mask using the first photo resist as an etching mask to form the connecting portion of the first opening;
    forming and patterning a second photo resist over the first hard mask; and
    etching the first hard mask using the second photo resist as an etching mask to form the two parallel portions of the first opening, wherein the two parallel portions overlap ends of the connecting portion.

8. A method comprising:
    forming a first hard mask over a base material;
    forming a second hard mask over the first hard mask;
    performing a first etching step on the second hard mask to form a first opening;
    performing a second etching step on the second hard mask to form a second opening and a third opening parallel to each other, wherein opposite ends of the first opening are connected to the second opening and the third opening to form an I-shaped opening;
    forming a blanket spacer layer over the second hard mask, wherein the blanket spacer layer extends into the I-shaped opening;
    removing portions of the blanket spacer layer over the second hard mask, with remaining portions of the blanket spacer layer forming spacers, wherein the spacers comprise a connecting portion filling an entirety of a portion of the first opening that connects the second opening and the third opening, and wherein center portions of the second opening and the third opening are unfilled by the spacers; and
    etching the second hard mask to remove portions of the second hard mask to form a fourth opening and a fifth opening in the second hard mask, wherein the fourth opening and the fifth opening are on opposite sides of the connecting portion of the spacers, and are between the second opening and the third opening.

9. The method of claim 8 further comprising:
    etching the first hard mask using the spacers and remaining portions of the second hard mask as an etching mask; and
    etching the base material to form openings in the base material, wherein the first hard mask is used as an additional etching mask in the etching the base material.

10. The method of claim 9 further comprising, after etching the base material to form openings in the base material, filling the openings with a material different from the base material.

11. The method of claim 8, wherein the first etching step and the second etching step are performed in separate processes using different photo resists.

12. The method of claim 8, wherein during the first etching step and the second etching step, the first hard mask is used as an etch stop layer.

13. The method of claim 8, wherein after the removing the portions of the blanket spacer layer, horizontal portions of the blanket spacer layer are removed, and vertical portions of the blanket spacer layer remain to form the spacers.

14. The method of claim 8, wherein the base material is a dielectric material.

15. A method comprising:
    depositing a first hard mask over a base layer;
    etching a first opening in the first hard mask, wherein the first opening comprises:
        a first portion and a second portion, the first portion being parallel to the second portion; and a third portion extending from the first portion to the second portion, the third portion being perpendicular to the first portion;

forming a spacer layer on sidewalls of the first opening, wherein a first portion of the spacer layer disposed on a first sidewall of the third portion of the first opening is merged with a second portion of the spacer layer disposed on a second sidewall of the third portion of the first opening;

etching a second opening in the first hard mask, wherein the second opening is interposed between the first portion of the first opening and the second portion of the first opening, and wherein the second opening is different from the first opening; and etching the base layer to extend the first opening and the second opening into the base layer, wherein an etching mask used during the etching the base layer comprises the spacer layer.

16. The method of claim 15, further comprising depositing a second hard mask over the base layer, the second hard mask being interposed between the first hard mask and the base layer.

17. The method of claim 16, wherein the etching mask further comprises the second hard mask.

18. The method of claim 16, further comprising etching the second hard mask using the spacer layer and the first hard mask as a combined etching mask.

19. The method of claim 15, wherein a width of the first portion of the first opening is greater than two times thickness of the spacer layer.

20. The method of claim 15, further comprising etching a third opening in the first hard mask, wherein a merged portion of the spacer layer is interposed between the second opening and the third opening.

* * * * *